(12) United States Patent
Lin (10) Patent No.: US 7,443,761 B2
(45) Date of Patent: Oct. 28, 2008

(54) LOOP FILTERING FOR FAST PLL LOCKING

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 276 days.

(21) Appl. No.: 11/358,266

(22) Filed: Feb. 21, 2006

(65) Prior Publication Data
US 2007/0195637 A1    Aug. 23, 2007

(51) Int. Cl.
*G11C 8/00*    (2006.01)
(52) U.S. Cl. .................. 365/233; 365/194; 327/156
(58) Field of Classification Search ............... 365/233, 365/194, 189.09, 189.01; 327/156, 161–163
See application file for complete search history.

(56) References Cited

U.S. PATENT DOCUMENTS

| | | | |
|---|---|---|---|
| 6,462,623 B1 * | 10/2002 | Horan et al. ................... 331/17 |
| 6,642,759 B1 * | 11/2003 | Hughes ....................... 327/157 |
| 6,779,126 B1 | 8/2004 | Lin et al. |
| 6,798,259 B2 | 9/2004 | Lin |
| 6,839,301 B2 | 1/2005 | Lin et al. |
| 6,845,458 B2 | 1/2005 | Lin |
| 6,845,459 B2 | 1/2005 | Lin |
| 6,868,504 B1 | 3/2005 | Lin |
| 6,912,666 B2 | 6/2005 | Lin |
| 6,950,487 B2 | 9/2005 | Lin et al. |
| 6,968,026 B1 * | 11/2005 | Li et al. ....................... 375/371 |
| 6,987,409 B2 * | 1/2006 | Kim et al. .................... 327/158 |
| 7,042,258 B2 * | 5/2006 | Booth et al. ................. 327/115 |
| 7,176,763 B2 * | 2/2007 | Park ............................. 331/17 |
| 7,180,334 B2 * | 2/2007 | Starr ......................... 327/156 |
| 7,230,495 B2 * | 6/2007 | Lee et al. ..................... 331/16 |
| 7,233,183 B1 * | 6/2007 | Sancheti ..................... 327/158 |
| 2002/0172314 A1 | 11/2002 | Lin et al. |
| 2005/0024108 A1 | 2/2005 | Lin |
| 2005/0134337 A1 | 6/2005 | Lee et al. |
| 2005/0140407 A1 | 6/2005 | Lin |
| 2005/0240791 A1 | 10/2005 | Lin |
| 2005/0242888 A1 | 11/2005 | Lee et al. |
| 2005/0286672 A1 | 12/2005 | Lin et al. |

OTHER PUBLICATIONS

Maneatis, John G., "Low-Jitter Process-Independent DLL and PLL Based on Self-Biased Techniques", IEEE Journal of Solid-State Circuits, vol. 31, No. 11 (Nov. 1996).

* cited by examiner

*Primary Examiner*—Gene N. Auduong
(74) *Attorney, Agent, or Firm*—Brooks, Cameron & Huebsch, PLLC (57) ABSTRACT

Methods, circuits, devices, and systems are provided for phase locked loop (PLL) locking. A method of locking a PLL includes locking a delay locked loop (DLL) path while applying a control voltage of the DLL path to a loop filter of the DLL path. The method includes locking a DLL voltage while applying the control voltage of the DLL path to the loop filter of the DLL path. The method also includes transferring the control voltage from the loop filter of the DLL path to a loop filter of the PLL path after the DLL voltage locks.

59 Claims, 6 Drawing Sheets

Fig. 6

LOOP FILTERING FOR FAST PLL LOCKING

TECHNICAL FIELD

The invention relates generally to phase locked loop (PLL) circuits, and more particularly, to the locking of PLL circuits by using DLL circuits.

BACKGROUND

A PLL circuit is an electrical system with electrical elements arranged in a loop. The electrical elements of a PLL circuit can include a phase frequency detector (PFD), a charge pump (CP), a loop filter (LF), a bias generator (BG), and a voltage controlled oscillator (VCO). These electrical elements can be connected on a circuit pathway that is a PLL.

In the loop of a PLL circuit, an output signal from an electrical element in the loop can be an input signal for a next electrical element in the loop. Thus, in a PLL, an output signal from a PFD can be an input signal for a CP, an output signal from the CP can be an input signal for a LF, an output signal from the LF can be an input signal for a BG, an output signal from the BG can be an input signal for a VCO, and an output signal from the VCO can be an input signal for the PFD. The signal from the VCO to the PFD is considered to be a feedback signal. In addition to the feedback signal, the PFD can also receive a reference signal from outside the loop of the PLL circuit.

A PLL circuit can lock the feedback signal to the reference signal. PLL locking can include frequency locking and phase locking. Frequency locking can include adjusting a frequency of the feedback signal to correspond with a frequency of the reference signal. Once this frequency locking adjustment is complete the PLL is considered to be frequency locked. Phase locking can include adjusting a phase of the feedback signal into a particular fixed phase relationship with the reference signal. Once this phase locking adjustment is complete the PLL is considered to be phase locked. Throughout this document, a PLL circuit that is frequency locked and phase locked is considered to be locked.

A delay locked loop (DLL) is also an electrical system with electrical elements arranged in a loop. The electrical elements of a DLL circuit can include a PD, a CP, a LF, a BG, and a voltage controlled delay line (VCDL). These electrical elements can be connected on a circuit pathway that is a DLL.

In the loop of a DLL circuit, an output signal from an electrical element in the loop can be an input signal for a next electrical element in the loop. Thus, in a DLL, an output signal from a PD can be an input signal for a CP, an output signal from the CP can be an input signal for a LF, an output signal from the LF can be an input signal for a BG, an output signal from the BG can be an input signal for a VCDL, and an output signal from the VCDL can be an input signal for the PD. The signal from the VCDL to the PD is considered to be a feedback signal. In addition to the feedback signal, the PD can also receive a reference signal from outside the loop of the DLL circuit. A DLL circuit can phase lock the feedback signal to the reference signal. Throughout this document, a DLL circuit that is phase locked is considered to be locked.

PLL circuits are widely used in many applications. For example, in one application, PLL circuits are used as multiphase clock generators that generate a plurality of clock signals phase-shifted in equally-spaced increments relative to a reference clock signal. PLL multi-phase clock generators are useful in electronic systems having complex timing requirements in which multi-function operations are completed during a single reference clock cycle or in which an operation extends over more than one reference clock cycle. In another application, PLL circuits are used as frequency multipliers that generate a clock signal having a higher frequency than the frequency of the reference clock signal.

Conventional PLL circuits have characteristically slow lock times. Lock time is the time required to lock. In particular, conventional PLL circuits lock both phases and frequencies in order to lock. This causes conventional PLL circuits to have increased lock time relative to other clock synchronization circuits (e.g., DLL circuits) that simply lock phases in order to lock. The relatively slow lock times of conventional PLL circuits are also attributable to the inability of conventional PLL circuits to adjust phase without simultaneously adjusting the frequency. Nevertheless, PLL circuits are useful in various applications, such as generating clock signals, recovering clock data, and synthesizing frequencies, as will be understood by one of ordinary skill in the art.

SUMMARY

Embodiments of the present disclosure include method, circuit, device, and system embodiments for phase locked loop locking. Embodiments of the present disclosure include various approaches to improving the settling response of a circuit that includes a DLL path and a PLL path. A first approach can include improving the settling response by comparing and adjusting signals within a LF circuit. A second approach can include improving the settling response by comparing signals with a PFD circuit and adjusting signals by using a CP circuit. The present disclosure includes various embodiments of the first approach, various embodiments of the second approach, as well as various embodiments with combinations of the two approaches.

A method embodiment for locking a PLL path can include locking a DLL path, locking a DLL voltage of the DLL path, and transferring a control voltage. The locking of the DLL path can occur while applying a control voltage of the DLL path to a DLL LF of the DLL path. The locking of the DLL voltage can occur while applying the control voltage of the DLL path to the LF of the PLL path. The transferring can include transferring the control voltage from the DLL LF of the DLL path to a PLL LF of the PLL path after the DLL voltage locks. In one method embodiment, the control voltage is transferred in response to a detection of the DLL voltage lock in a LF circuit shared by the DLL path and the PLL path. For some method embodiments, after the DLL voltage locks, the control voltage is applied through a bias generator shared by the DLL path and the PLL path to a VCO of the PLL path. Various method embodiments can also include locking the PLL path by using a PFD shared by the DLL path and the PLL path after the DLL voltage locks.

A circuit embodiment of the present disclosure can include a DLL path and a PLL path that share a LF circuit. The DLL path can include a PFD circuit, a CP circuit, a LF circuit, a BG, and a VCDL, while the PLL path can include the PFD circuit, the CP circuit, the LF circuit, the BG and a VCO. In this circuit embodiment, the LF circuit can include a DLL LF, a PLL LF, and a CP with an output from the CP of the LF circuit connected to the PLL LF. Various embodiments of this circuit can also be incorporated into a memory device and a processor based system.

DETAILED DESCRIPTION

A PLL can use a DLL to assist in locking the PLL, as described in a copending, commonly assigned US Patent Application 2005/0242888 A1. In this technique, a PLL and a DLL can share some of the same electrical elements. For example, as illustrated in US Patent Application 2005/0242888 A1, a DLL can share a PLL's PFD, and use that PFD as a PD in the DLL.

However, in using a DLL to assist in locking a PLL, the PLL and the DLL may not share all of the same electrical components. For example, a PLL and a DLL may not share a VCO or a VCDL on the same circuit pathway, since a feedback signal from a VCO can differ from a feedback signal from a VCDL. Also as an example, a PLL and a DLL may not share the same LF, since a DLL LF can differ from a PLL LF. A LF for a PLL can differ from a LF for a DLL in various ways. For example, a DLL LF can be a first order LF while a PLL LF can be a second order LF.

Figure 1:
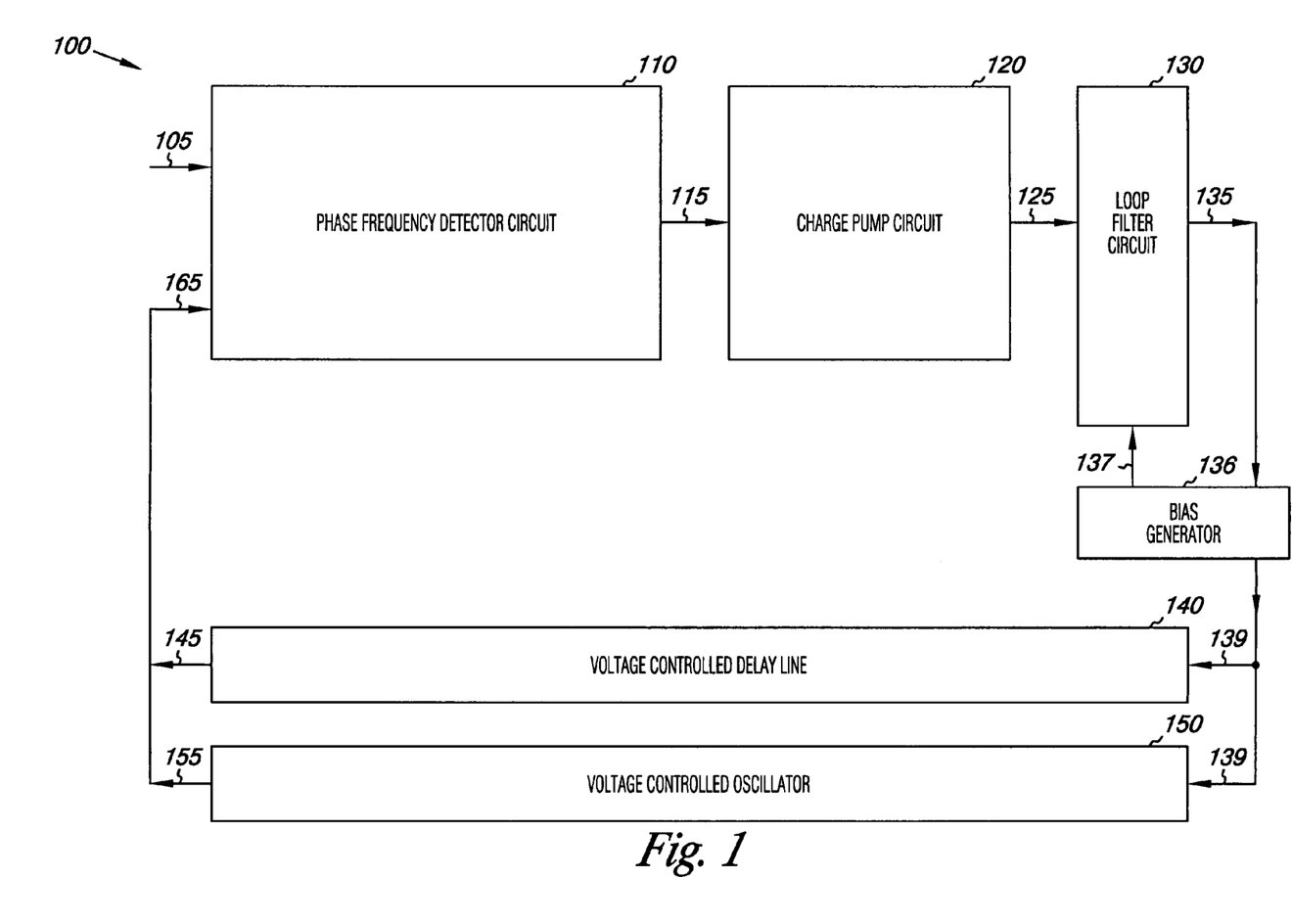
FIG. 1 illustrates a circuit that includes a DLL path and a PLL path, suitable for implementation with embodiments of the present disclosure.

FIG. 1 illustrates a circuit 100 that includes a DLL path and a PLL path, as can be used in a synchronization circuit. This circuit 100 is described in more detail in the above mentioned, copending, commonly assigned US Patent Application 2005/0242888 A1. FIG. 1 is intended to illustrate various circuit blocks and electrical components according to the present disclosure. In FIG. 1 various connections between circuit blocks/components/elements are provided. FIG. 1, however, is not intended to illustrate all circuit details. Circuit pathways and connections shown in FIG. 1 are sometimes described in this document with reference to signals carried on such pathways and connections. The DLL path of the circuit 100 can include a PFD circuit 110, a CP circuit 120, a LF circuit 130, a BG 136, and a VCDL 140. The PLL path of the circuit 100 can include the PFD circuit 110, the CP circuit 120, the LF circuit 130, the BG 136, and a VCO 150.

The PFD circuit 110 can receive a reference signal 105 and a feedback signal 165. For the DLL path, the feedback signal 165 can be an output signal 145 of the VCDL 140. For the PLL path, the feedback signal 165 can be an output signal 155 of the VCO 150. The reference signal 105 can be a reference signal for the DLL path and/or a reference signal for the PLL path, which can be different reference signals in various embodiments. The PFD circuit 110 can detect a frequency and/or phase difference between the reference signal 105 and the feedback signal 165 and can transmit a control signal 115 to the CP circuit 120.

The control signal 115 can direct a CP in the CP circuit 120 to pump a CP output signal 125 up or down, based on the difference detected by the PFD circuit 110. The CP output signal 125 can be transmitted to the LF circuit 130, which can filter the CP output signal 125 and can transmit a filtered signal 135 to the BG 136. The BG 136 can generate a bias-N voltage and a bias-P voltage. The BG 136 can transmit the bias-N voltage and/or the bias-P voltage as a BG output signal 137 to the LF circuit 130. The BG 136 can also transmit the bias-N voltage and/or the bias-P voltage as a BG output signal 139 to the VCDL 140 and/or the VCO 150.

For the DLL path, the VCDL 140 can receive the BG output signal 139, which can act as a voltage control of the VCDL 140 to generate an output signal 145 for use as a feedback signal to the PFD circuit 110. For the PLL path, the VCO 150 can also receive the BG output signal 139, which can act as a voltage control of the VCO 150 to generate an output signal 155 for use as a feedback signal to the PFD circuit 110.

The DLL path assists in locking the PLL path for the DLL/PLL circuit 100. As the reader will appreciate, a DLL can lock more quickly than a PLL. When a VCDL and a VCO of a DLL/PLL circuit use substantially the same voltage controlled delay units and the DLL path locks, the control voltage for the VCDL can then be used as the control voltage for the VCO to lock the PLL path of the DLL/PLL circuit. Loop filtering embodiments of the present disclosure can be used with the DLL/PLL circuit 100 to lock the DLL path then quickly lock the PLL path. For example, a loop filter circuit 300 of FIG. 3 can be used as the loop filter circuit 130. In this example, the DLL/PLL circuit 100 can switch from the DLL path to the PLL path, in response to a signal from the loop filter circuit 300 indicating DLL voltage lock, as described in connection with FIG. 3. The timing of events in embodiments of a DLL/PLL circuit is shown in FIG. 2.

Figure 2:
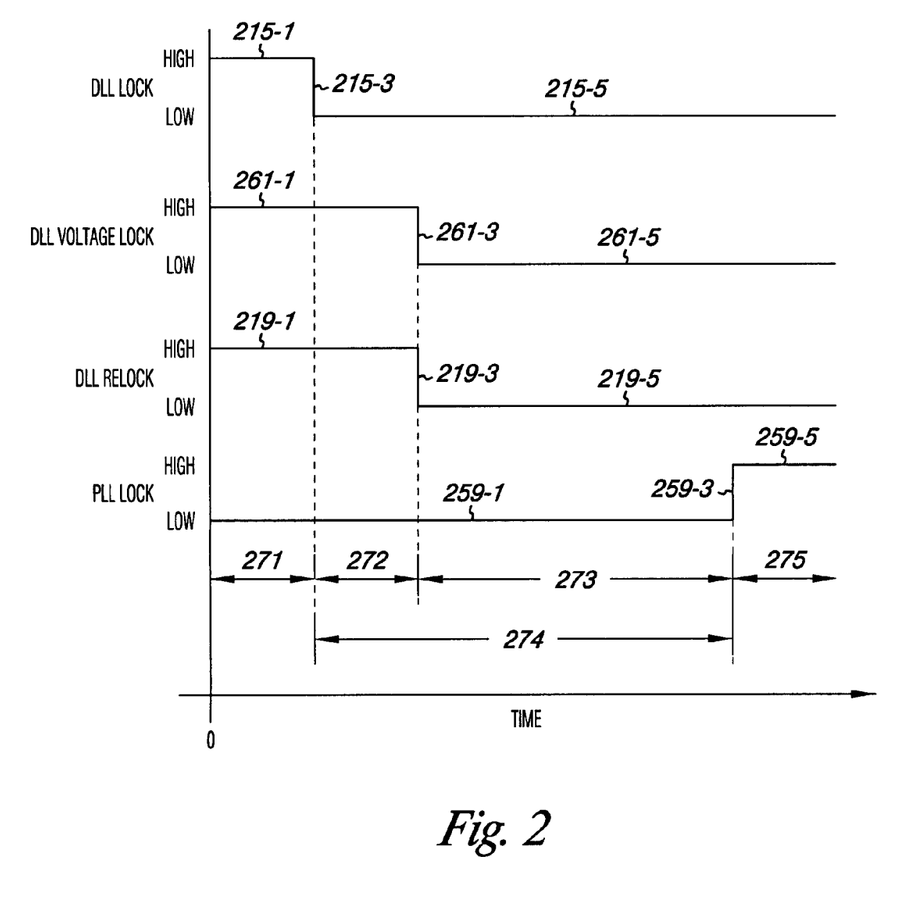
FIG. 2 illustrates a timing diagram for events in a circuit that includes a DLL path and a PLL path.

FIG. 2 illustrates a timing diagram for events in an embodiment of a DLL/PLL circuit that includes a DLL path and a PLL path, such as the circuit of FIG. 1. FIG. 2 is intended to illustrate orders of events and is not intended to illustrate a specific time for any particular event. At time equals zero in the timing diagram, the DLL path is unlocked as indicated by DLL lock signal high 215-1, the DLL voltage is unlocked as indicated by DLL voltage lock signal high 261-1, the DLL path has not been relocked as indicated by DLL relock signal high 219-1 and the PLL path is unlocked as indicated by PLL lock signal low 259-1.

During time period 271, the DLL path is in the process of locking. At the end of the time period 271, the DLL path locks as indicated by the DLL lock signal drop at 215-3 to DLL lock signal low 215-5. In a previous approach (not shown), after the DLL path locks the PLL path can immediately begin the process of locking.

In an embodiment of the present disclosure, the DLL/PLL circuit can use loop filtering, as described in connection with FIG. 3, to lock the DLL voltage then lock the PLL path. In this embodiment, the DLL voltage is in the process of locking during time periods 271 and 272. At the end of the time period 272, the DLL voltage locks as indicated by the DLL voltage lock signal drop at 261-3 to DLL voltage lock signal low 261-5. Also in this embodiment, the PLL path is in the process of locking during time period 273 and the PLL locks at the end of the time period 273, as indicated by the PLL lock signal rise at 259-3 to PLL lock signal high 259-5. The PLL path is locked during time 275. In this embodiment, the DLL voltage lock at 261-3 can improve a settling response of the DLL/PLL circuit and allow the PLL path to lock more quickly than an approach in which the PLL path begins locking immediately after the DLL path locks.

In another embodiment of the present disclosure, after the DLL path locks, the DLL/PLL circuit can use loop filtering, as described in connection with FIGS. 4 and 5, to relock the DLL path then lock the PLL path. In this embodiment, during time period 272, the DLL path is in the process of relocking. At the end of the time period 272, the DLL path relocks as indicated by the DLL relock signal drop at 219-3 to DLL relock signal low 219-5. For ease of illustration, the time of 219-3 is shown as the same time as 261-3, however in various embodiments the time of 219-3 can differ from the time of 261-3. Also in this embodiment, the PLL path is in the process of locking during time period 273 and the PLL locks at the end of the time period 273, as indicated by the PLL lock signal rise at 259-3 to PLL lock signal high 259-5. The PLL path is locked during time 275. In this embodiment, the DLL relock at 219-3 can improve a settling response of the DLL/PLL circuit and allow the PLL path to lock more quickly than an approach in which the PLL path begins locking immediately after the DLL path locks.

Figure 3:
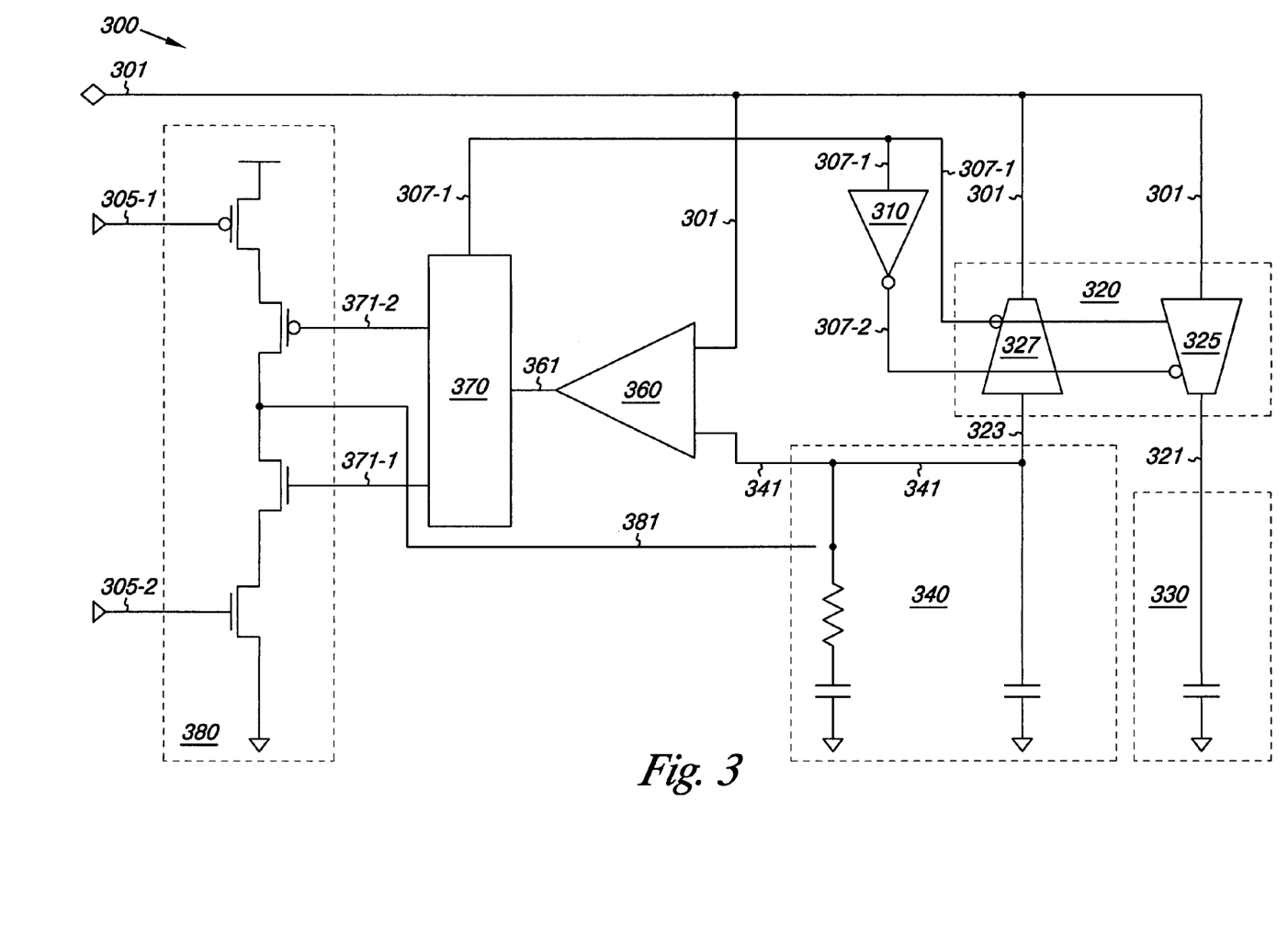
FIG. 3 illustrates a loop filter circuit according to embodiments of the present disclosure.
Figure 4:
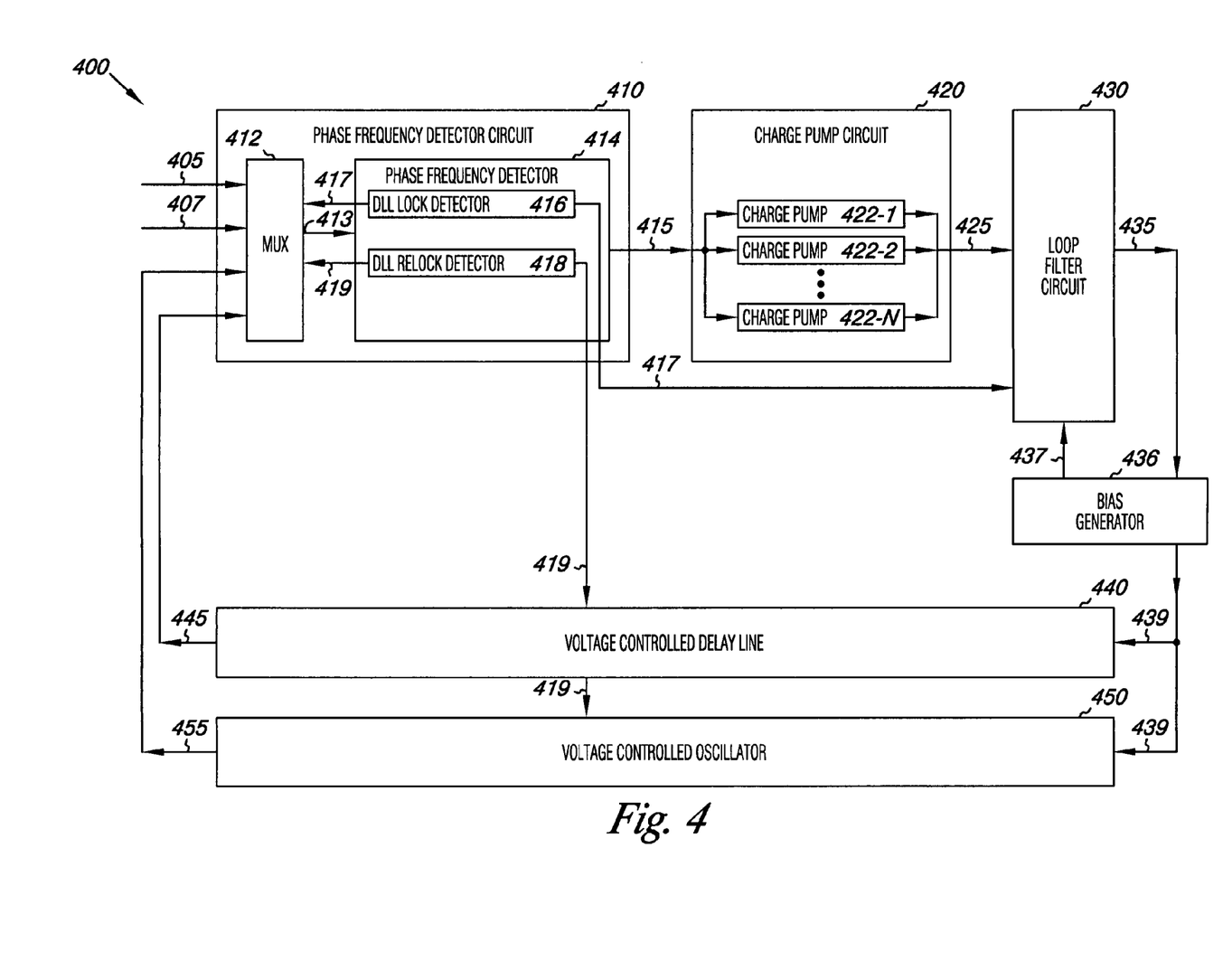
FIG. 4 illustrates a circuit that includes a DLL path and a PLL path according to embodiments of the present disclosure.
Figure 5:
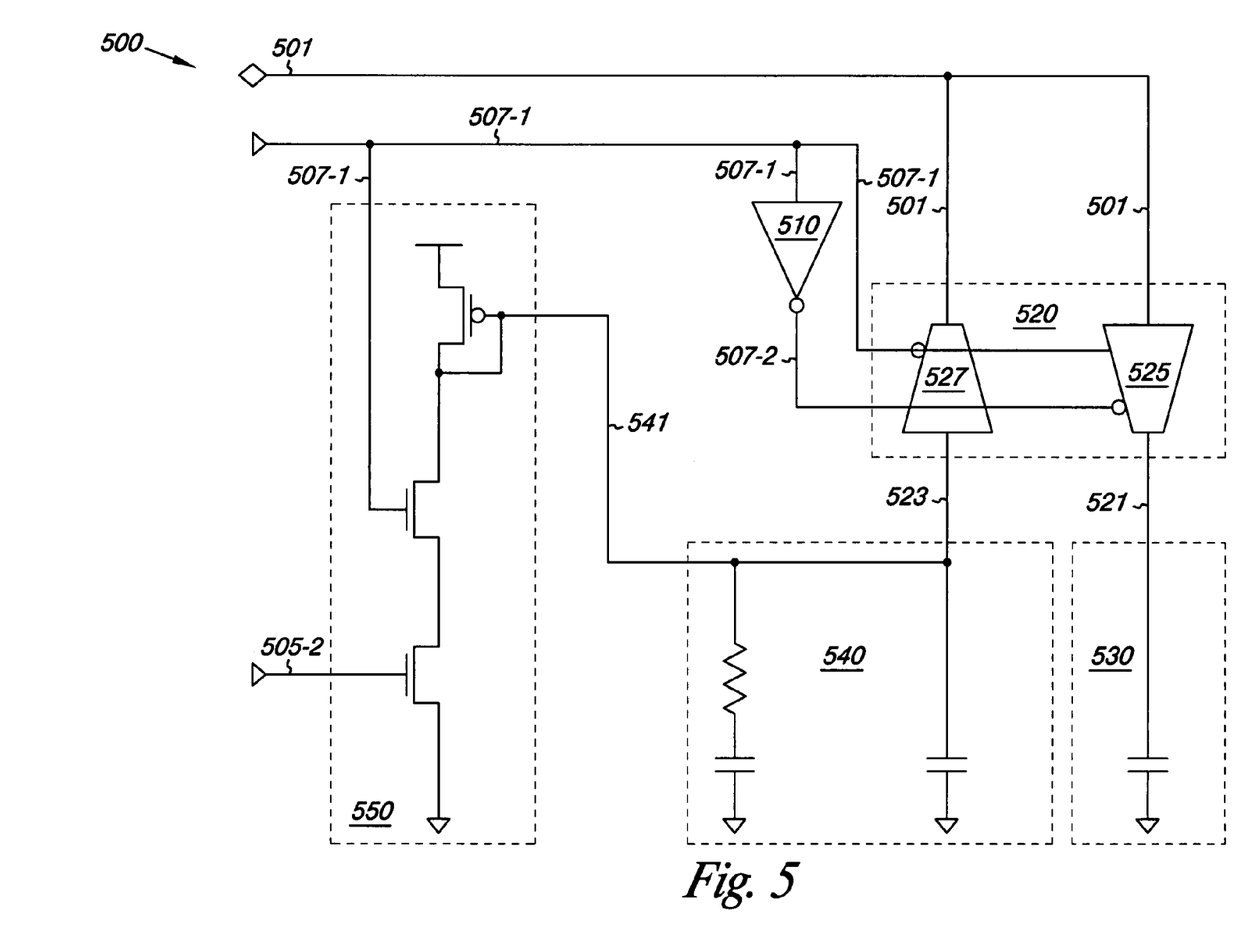
FIG. 5 illustrates a loop filter circuit according to embodiments of the present disclosure.

FIGS. 3-5 are intended to illustrate various circuit embodiments according to the present disclosure. In FIGS. 3-5, various connections between circuit elements are provided. FIGS. 3-5 are not intended, however, to illustrate all circuit details. Circuit pathways and connections shown in FIGS. 3-5 are sometimes described in this document with reference to signals carried on such pathways and connections.

FIG. 3 illustrates an embodiment of a LF circuit 300. As shown in FIG. 3, the LF circuit 300 includes various signals connected to one or more circuits outside the LF circuit 300, including a control voltage 301, a bias-P voltage 305-1, and a bias-N voltage 305-2. The LF circuit 300 of FIG. 3 includes an inverter 310, a switch circuit 320 with a first switch 325 and a second switch 327, a DLL LF 330, a PLL LF 340, a comparator 360, a controller 370, and a LF CP 380. The embodiment of FIG. 3 also includes various signals connected between elements of the LF circuit 300, including a DLL voltage lock signal 307-1, an inverted DLL voltage lock signal 307-2, a first switch circuit output signal 321, a second switch circuit output signal 323, a PLL internal voltage 341, a comparator output signal 361, a down controller output 371-1, an up controller output 371-2, and a CP output signal 381.

In various embodiments, the LF circuit 300 can be connected in a DLL/PLL circuit, as the LF circuit 130 is connected in the circuit of FIG. 1. In connection with FIG. 3, a reference to "the DLL path" refers to the DLL portion of the DLL/PLL circuit, e.g. circuit 100 of FIG. 1, and a reference to "the PLL path" refers to the PLL portion of such a DLL/PLL circuit.

The control voltage 301 can be a CP output signal, e.g. 125 in FIG. 1, from the DLL/PLL circuit to be filtered by the LF circuit 130. The bias-P voltage 305-1 and the bias-N voltage 305-2 can be a BG output signal, e.g. 137 in FIG. 1, to enable the LF CP 380 to pump the CP output signal 381 up and down.

As shown in the embodiment of FIG. 3, the comparator 360 can receive the control voltage 301 as a first input signal to be compared. The switch circuit 320 can switchably connect the control voltage 301 to the DLL LF 330 and the PLL LF 340. In the embodiment of FIG. 3, the first switch 325 of the switch circuit 320 can switchably connect the control voltage 301 to produce a first switch circuit output signal 321 for the DLL LF 330. The second switch 327 of the switch circuit 320 can switchably connect the control voltage 301 to produce a second switch circuit output signal 323 for the PLL LF 340.

The switch circuit 320 can be configured to switchably connect the control voltage 301 to the DLL LF 330 and the PLL LF 340 in response to one or more signals indicating whether or not the DLL voltage is locking and/or has locked, as described below. The first switch 325 of the switch circuit 320 can be configured to switchably connect the control voltage 301 as the first switch circuit output signal 321 to the DLL LF 330 in response to a signal indicating that the DLL voltage is locking and/or has not yet locked. The second switch 327 of the switch circuit 320 can be configured to switchably connect the control voltage 301 as the second switch circuit output signal 323 to the PLL LF 340 in response to a signal indicating that the DLL voltage has locked. Various other switching configurations can also be used to perform these switching functions, as will be understood by one of ordinary skill in the art. Embodiments are not limited to the example provided in FIG. 3.

The inverter 310 can invert the DLL voltage lock signal 307-1 to form the inverted DLL voltage lock signal 307-2. As an example, the DLL lock signal 307-1 can be a two state signal, with a first state indicating that the DLL voltage is locking but not yet locked and a second state indicating that the DLL voltage has locked. In this example, the inverter 310 can invert the DLL voltage lock signal 307-1 from the first state to the second state or vice versa. In the embodiment of FIG. 3, the first switch 325 of the switch circuit 320 receives the DLL voltage lock signal 307-1 and the inverted DLL voltage lock signal 307-2 as input signals to respective N or P-MOS transistors in addition to the control voltage 301 as the same will be appreciated by one of ordinary skill in the art upon reading this disclosure.

In the embodiment of FIG. 3, the DLL LF 330 can be a first order LF. For ease of illustration, the first order DLL LF 330 is illustrated as including one leg with one capacitor. Embodiments, however are not limited to this simplified illustration. In the embodiment of FIG. 3, the PLL LF 340 can be a second order LF, including a first leg in parallel with a second leg, wherein the first leg includes one capacitor and the second leg includes one capacitor in series with one resistor. In various embodiments of the PLL LF 340, the capacitor of the second leg can have a capacitance at least ten times greater than a capacitance of the capacitor in the first leg. In some embodiments, the capacitance of the capacitor of the second leg of the PLL LF 340 can also be substantially greater than a capacitance of the capacitor of the DLL LF 330. Thus, the PLL LF 340 can have a relatively large time constant and can charge more slowly than the DLL LF 330, as will be understood by one of ordinary skill in the art. As the reader will appreciate, in various embodiments the DLL LF 330 and/or the PLL LF 340 can be various LFs, such as a third order LF, an active LF, and/or a self-biased LF using a double CP configuration, however embodiments are not so limited.

The comparator of the LF circuit 300 can compare a first input signal, e.g. the control voltage 301, to a second input signal, e.g. the PLL internal voltage 341, and provide an output based on a difference between the compared signals. The comparator 360 can provide the comparator output signal 361 based on a difference between the control voltage 301 and the PLL internal voltage 341. In the embodiment of FIG. 3, the comparator 360 can provide the comparator output signal 361 to the controller 370.

The controller 370 of the LF circuit 300 can provide one or more controller outputs to the LF CP 380, based on the comparator output signal 361 received from the comparator 360. The controller 370 can receive the comparator output signal 361 from the comparator 360. The controller 370 can be configured to provide the controller outputs 371-1 and 371-2. As the reader will appreciate, the controller 370 can be configured provide a down controller output 371-1 and/or an up controller output 371-2 to the LF CP 380, based on the comparator output signal 361 from the comparator 360. For example, if the comparator output signal 361 indicates that the PLL internal voltage 341 is greater than the control voltage 301, then the controller can transmit a down controller output 371-1 to the LF CP 380. Also as an example, if the comparator output signal 361 indicates that the PLL internal voltage 341 is less than the control voltage 301, then the controller can transmit an up controller output 371-2 to the LF CP 380.

The controller 370 can also be configured to provide the DLL voltage lock signal 307-1, which can indicate whether or not there is a DLL voltage lock. In various embodiments, the controller 370 can use the comparator output signal 361 to detect a DLL voltage lock by determining that a difference between the control voltage 301 and the PLL internal voltage 341 is within a particular range. When the PLL internal voltage 341 is substantially equal to the control voltage 301, the DLL voltage is considered to be locked. The controller 370 can transmit the DLL voltage lock signal 307-1 to the inverter 310, to the switch circuit 320, and to various elements of the DLL/PLL circuit, such as the circuit 100 of FIG. 1.

The LF CP 380 of the LF circuit 300 can use one or more controller outputs to pump the CP output 381 up and/or down. In the embodiment of FIG. 3, the LF CP 380 can use outputs from the controller 370 to pump the CP output signal 381 up and/or down, which can adjust the PLL internal voltage 341 toward the control voltage 301. In response to a down controller input 371-1, the LF CP 380 can produce a pump down CP output signal 381, which can lower the PLL internal voltage 341 toward the control voltage 301. In response to an up controller input 371-2, the LF CP 380 can produce a pump up CP output signal 381, which can raise the PLL internal voltage 341 toward the control voltage 301. This pumping up and/or down by the LF CP 380 can be repeated, as will be understood by one of ordinary skill in the art, until the PLL internal voltage 341 is substantially equal to the control voltage 301 so the DLL voltage is locked.

In various embodiments of the present disclosure, the control voltage 301 and/or the PLL internal voltage 341 can be set prior to DLL voltage locking so there is a voltage difference between. As a result, when the DLL voltage begins the process of locking, the comparator 360 can detect that difference and can provide the comparator output signal 361, indicating that difference to the controller 370, which can, in turn, provide the DLL voltage lock signal 307-1 indicating that the DLL voltage has not yet locked.

When the DLL voltage lock signal 307-1 indicates that the DLL voltage is locking and/or has not locked, the first switch 325 of the switch circuit 320 can connect the control voltage 301 as the first switch circuit output signal 321, and the DLL LF 330 can begin to charge and filter the control voltage 301 of the DLL path. Also when the DLL voltage is locking, the comparator 360, the controller 370, and the LF CP 380 can begin to adjust the PLL internal voltage 341 toward the control voltage 301, as described above.

When the PLL internal voltage 341 is adjusted for DLL voltage lock, the controller 370 can provide the DLL voltage lock signal 307-1 indicating that the DLL voltage is not locking and/or has locked. After the DLL voltage locks, the second switch 327 of the switch circuit 320 can connect the control voltage 301 as the second switch circuit output signal 323, and the LF CP 380 can stop adjusting the PLL internal voltage 341. The DLL voltage lock signal 307-1 indicating DLL voltage lock can also be provided to the elements of the DLL/PLL circuit, such as the circuit 100, so that the circuit can switch from the DLL path to the PLL path when the DLL voltage locks. Thus, in embodiments of the present disclosure, the PLL internal voltage 341 can be adjusted to substantially equal the control voltage 301 before the PLL path of the DLL/PLL circuit begins the process of locking.

The LF circuit 300 thus can be used, e.g. as the LF circuit 130 in FIG. 1, in a DLL/PLL circuit, e.g. the circuit 100 of FIG. 1, to improve a settling response of the circuit. In embodiments described in connection with FIGS. 1 and 3, the PLL path of the DLL/PLL circuit can lock more quickly than an approach in which the PLL path begins locking immediately after the DLL path locks. Other embodiments of a DLL/PLL circuit are described in connection with FIGS. 4 and 5.

FIG. 4 illustrates an embodiment of a DLL/PLL circuit 400 that includes a DLL path and a PLL path, as can be used in a synchronization circuit. The embodiment of FIG. 4 includes various signals connected to one or more circuits outside the circuit 400, including a reference signal for the DLL 405 and a reference signal for the PLL 407. The DLL path of the circuit 400 includes a PFD circuit 410, a CP circuit 420, a LF circuit 430, a BG 436, and a VCDL 440. The PLL path of the circuit 400 includes the PFD circuit 410, the CP circuit 420, the LF circuit 430, the BG 436, and a VCO 450.

These elements of the circuit 400 can include additional elements, which can be configured in various ways. The PFD circuit 410 includes a multiplexer 412 and a PFD 414, which includes a DLL lock detector 416 and a DLL relock detector 418. The CP circuit 420 includes a first CP 422-1, a second CP 422-2, and an Nth CP 422-N, where N represents a scalable number. In various embodiments, the LF circuit 430 can be LF circuit 500, as described in connection with FIG. 5. The embodiment of FIG. 4 also includes various signals connected between elements of the circuit 400, including a multiplexer output signal 413, a control signal 415, a DLL lock signal 417, a DLL relock signal 419, a CP output signal 425, a filtered signal 435, a BG output signal 437, a BG output signal 439, a VCDL output signal 445, and a VCO output signal 455.

In the embodiment of FIG. 4, signals connected to one or more circuits outside the circuit 400 can be provided in various ways for various functions. The reference signal for the DLL 405 and the reference signal for the PLL 407 can be provided by one or more clock circuits, as will be understood by one of ordinary skill in the art. These reference signals can be used by the PFD circuit 410 in locking the DLL path, relocking the DLL path, and locking the PLL path, as described below.

In the embodiment of FIG. 4, the multiplexer 412 receives the reference signal for the DLL 405, the reference signal for the PLL 407, the VCDL output signal 445, and the VCO output signal 455. The multiplexer 412 can receive the DLL lock signal 417 from the DLL lock detector 416 and can also receive the DLL relock signal 419 from the DLL relock detector 418. The DLL lock signal 417 can indicate whether or not the DLL path is locking and/or has locked. The DLL relock signal 419 can indicate whether or not the DLL path is relocking and/or has relocked.

In the embodiment of FIG. 4, the multiplexer 412 can be configured to transmit at least some of the signals that the multiplexer 412 receives, in response to one or more signals indicating a status of the DLL path. The multiplexer 412 can be configured to transmit the reference signal for the DLL 405 and the VCDL output signal 445 to the PFD 414, while the DLL path is locking or relocking, as indicated by the DLL lock signal 417 and/or the DLL relock signal 419. The multiplexer 412 can also be configured to transmit the reference signal for the PLL 407 and the VCO output signal 455 to the PFD 414, when the DLL path has relocked, as indicated by the DLL relock signal 419. For ease of illustration, the multiplexer output signal 413 can represent one or more signals transmitted from the multiplexer 412 to the PFD 414. For example, the multiplexer output signal 413 can represent the reference signal for the DLL 405 and the VCDL output signal 445. Also as an example, the multiplexer output signal 413 can represent the reference signal for the PLL 407 and the VCO output signal 455.

A PFD of the PFD circuit 410 can be configured to receive signals and detect a frequency and/or a phase difference between the received signals. When the PFD 414 receives a multiplexer output signal 413 that includes the reference signal for the DLL 405 and the VCDL output signal 445, the PFD 414 can act as a PD and detect a phase difference between the reference signal for the DLL 405 and the VCDL output signal 445. When the PFD 414 receives a multiplexer output signal 413 that includes the reference signal for the PLL 407 and the VCO output signal 455, the PFD 414 can act as a PFD and detect a phase difference and a frequency difference between the reference signal for the PLL 407 and the VCO output signal 455.

As shown in the embodiment of FIG. 4, the PFD 414 of the PFD circuit 410 can also include the DLL lock detector 416 and the DLL relock detector 418. In the embodiment of FIG. 4, the DLL path can lock, then lose lock, then relock. In various embodiments, the DLL lock detector 416 can detect when the DLL path locks by determining that a phase difference between the reference signal for the DLL 405 and the VCDL output signal 445 is within a particular range. Similarly, after the DLL locks, then loses lock, the DLL relock detector 418 can detect when the DLL path relocks by determining that a phase difference between the reference signal for the DLL 405 and the VCDL output signal 445 is within a particular range. In various embodiments, the DLL lock detector 416 can share some or all circuit elements with the DLL relock detector 418, as will be understood by one of ordinary skill in the art. The PFD circuit 414 can, in some embodiments, also include a PLL lock detector, which can detect when the PLL path locks by determining that a phase difference and a frequency difference between the reference signal for the PLL 407 and the VCO output signal 455 are within particular ranges.

In the embodiment of FIG. 4, the DLL lock detector 416 can transmit the DLL lock signal 417 to the multiplexer 412 and the LF circuit 430. The LF circuit 430 can use the DLL lock signal 417 in various ways, as described in connection with FIG. 5. The DLL relock detector can transmit the DLL relock signal 419 to the multiplexer 412, the VCDL 440, and the VCO 450. The VCDL 440 and the VCO 450 can also use the DLL relock signal 419 in various ways, as described below.

The PFD circuit 410 can transmit a control signal 415 to the CP circuit 420. The control signal 415 can direct one or more CPs in the CP circuit 420 to pump the CP output signal 425 up or down, based on the phase and/or frequency difference detected by the PFD 414.

In the embodiment of FIG. 4, the CP circuit 420 includes three CPs in parallel. The CP circuit 420 includes the first CP 422-1, the second CP 422-2, and the Nth CP 422-N. These CPs can pump the CP output signal 425 up or down, as directed by the control signal 415. Various numbers of CPs can be used for this pumping. For example, a double charge pump configuration can be used for a self-biased PLL. The CP circuit 420 can transmit the CP output signal 425 to the LF circuit 430. The LF circuit 430 can filter the CP output signal 425 and can transmit the filtered signal 435 to the BG 436. The BG 436 can generate a bias-N voltage and a bias-P voltage. The BG 436 can transmit the bias-N voltage and/or the bias-P voltage as a BG output signal 437 to the LF circuit 430. The BG 436 can also transmit the bias-N voltage and/or the bias-P voltage as a BG output signal 439 to the VCDL 440 and/or the VCO 450. In various embodiments, the LF circuit 430 can be the LF circuit 500 of FIG. 5, as described in connection with FIG. 5.

For the DLL path, the VCDL 440 can receive the BG output signal 439, which can act as a voltage control of the VCDL 440. The VCDL 440 can use the voltage control of the BG output signal 439 to generate an output signal 445, and can transmit the VCDL output signal 445 to the PFD circuit 410, for use as a feedback signal. For the PLL path, the VCO 450 can also receive the BG output signal 439, which can act as a voltage control of the VCO 450. The VCO 450 can use the voltage control of the BG output signal 439 to generate an output signal 455, and can transmit the output signal 455 to the PFD circuit 410, for use as a feedback signal. Embodiments of the circuit 400 can be used to improve a settling response of the circuit and allow the PLL path to also lock more quickly, when the LF circuit 430 uses loop filtering embodiments described in connection with FIG. 5.

FIG. 5 illustrates an embodiment of a LF circuit 500. The embodiment of FIG. 5 includes various signals connected to one or more circuits outside the LF circuit 500, including a control voltage 501, a bias-N voltage 505-2, and a DLL lock signal 507-1. The LF circuit 500 of FIG. 5 includes an inverter 510, a switch circuit 520 with a first switch 525 and a second switch 527, a DLL LF 530, a PLL LF 540, and a current mirror circuit 550. The embodiment of FIG. 5 also includes various signals connected between elements of the LF circuit 500, including an inverted DLL lock signal 507-2, a first switch circuit output 521, a second switch circuit output 523, and a PLL internal voltage 541.

In various embodiments, the LF circuit 500 can be connected to a circuit that includes a DLL and a PLL that share common circuit elements. In connection with FIG. 5, a reference to "the DLL/PLL circuit" refers to such a circuit. Also, in connection with FIG. 5, a reference to "the DLL path" refers to the DLL portion of the DLL/PLL circuit and a reference to "the PLL path" refers to the PLL portion of the DLL/PLL circuit. As an example, the DLL/PLL circuit can be the circuit 400 of FIG. 4, and the LF circuit 500 of FIG. 5 can be the LF circuit 430 of FIG. 4.

In the embodiment of FIG. 5, signals connected to one or more circuits outside the LF circuit 500 can be provided in various ways for various functions. The control voltage 501 can be a CP output signal from a CP circuit of the DLL/PLL circuit to be filtered by the LF circuit 500. For example, the control voltage 501 can be the CP output signal 425 of the circuit 400 of FIG. 4. The bias-N voltage 505-2 can be provided by a bias generator for current mirroring. For example, the bias-N voltage 505-2 can be the BG output signal 439 of the circuit 400 of FIG. 4. The DLL lock signal 507-1 can be provided by a DLL lock detector, as described in connection with FIG. 4, and can indicate whether or not the DLL path has locked.

Elements of the LF circuit 500 of FIG. 5 can use these signals in various ways. The switch circuit 520 can switchably connect the control voltage 501 to the DLL LF 530 and the PLL LF 540. The first switch 525 of the switch circuit 520 can switchably connect the control voltage 501 to a first switch circuit output 521 for the DLL LF 530. The second switch 527 of the switch circuit 520 can switchably connect the control voltage 501 to a second switch circuit output 523 for the PLL LF 540.

The switch circuit 520 can be configured to switchably connect the control voltage 501 to the DLL LF 530 and the PLL LF 540 in response to one or more signals indicating whether or not the DLL path is locking and/or has locked. The first switch 525 of the switch circuit 520 can be configured to switchably connect the control voltage 501 to the DLL LF 530 in response to a signal indicating that the DLL path is locking and/or has not yet relocked. The second switch 527 of the switch circuit 520 can be configured to switchably connect the control voltage 501 to the PLL LF 540 in response to a signal indicating that the DLL path has locked and/or is relocking. Various other switching configurations can also be used to perform these switching functions, as will be understood by one of ordinary skill in the art.

The inverter 510 can invert the DLL lock signal 507-1 to form the inverted DLL lock signal 507-2. As an example, the DLL lock signal 507-1 can be a two state signal, with a first state indicating that the DLL path is locking but not yet locked and a second state indicating that the DLL path has locked. In this example, the inverter 510 can invert the DLL lock signal 507-1 from the first state to the second state or vice versa. The switch circuit 520 can receive the DLL lock signal 507-1 and the inverted DLL lock signal 507-2.

In the embodiment of FIG. 5, the DLL LF 530 can be a first order LF and the PLL LF 540 can be a second order LF, as described in connection with FIG. 3. The PLL LF 540 can have a relatively large time constant and can charge more slowly than the DLL LF 530. Various configurations of LFs can be used in the embodiment of FIG. 5, as will be understood by one of ordinary skill in the art.

The current mirror circuit 550 of the LF circuit 500 can mirror the bias-N voltage 505-2 in response to one or more signals indicating whether or not the DLL path is locking and/or locked. The current mirror circuit 550 can receive the DLL lock signal 507-1, described above. The current mirror circuit 550 can be configured to charge the PLL LF 540 in response to a signal indicating that the DLL path is locking and/or has not yet locked. The current mirror circuit 550 can also be configured to stop charging the PLL LF 540 in response to a signal indicating that the DLL path is not locking and/or has locked.

When the DLL is locking, the first switch 525 of the switch circuit 520 can connect the control voltage 501 as the first switch circuit output signal 521, and the DLL LF 530 can begin to charge and filter the control voltage 501 of the DLL path. Also when the DLL is locking, the current mirror circuit 550 can begin to charge the PLL LF 540.

After the DLL locks, the second switch 527 of the switch circuit 520 can connect the control voltage 501 as the second switch circuit output signal 523, and the current mirror circuit 550 can stop charging the PLL LF 540. Since the PLL LF 540 can be at least partially charged from the current mirror 550, there may be some charge sharing between the control voltage 501 and the PLL internal voltage 541 when the second switch 527 connects the control voltage 501 as the second switch circuit output signal 523.

When the DLL is relocking, a partial charge of the PLL LF 540, received from the current mirror circuit 550 during DLL locking, can provide a large initial phase adjustment for the DLL path. While the DLL is relocking, the PLL LF 540 can begin to filter the control voltage 501 of the DLL path. After the large initial phase adjustment, pumping from a CP, such as the CP circuit 420, can provide smaller subsequent phase adjustments for the DLL path, as described in connection with FIG. 4, until the DLL path relocks.

After the DLL relocks, the DLL/PLL circuit can switch from the DLL path to the PLL path, as described in connection with FIG. 4. The PLL path can then begin the process of locking. Since the PLL LF 540 can be at least partially charged from the current mirror 550 during DLL locking and/or from the pumping from a CP during relocking, the PLL LF 540 can be fully charged before the PLL path of the DLL/PLL circuit begins the process of locking.

The LF circuit 500 thus can be used, e.g. as the LF circuit 430 in FIG. 4, in a DLL/PLL circuit, e.g. the circuit 400 of FIG. 4, to improve a settling response of the circuit. In embodiments described in connection with FIGS. 4 and 5, the PLL path of the DLL/PLL circuit can lock more quickly than an approach in which the PLL path begins locking immediately after the DLL path locks. Such a DLL/PLL circuit can also be incorporated into a memory device, as described in connection with FIG. 6.

Figure 6:
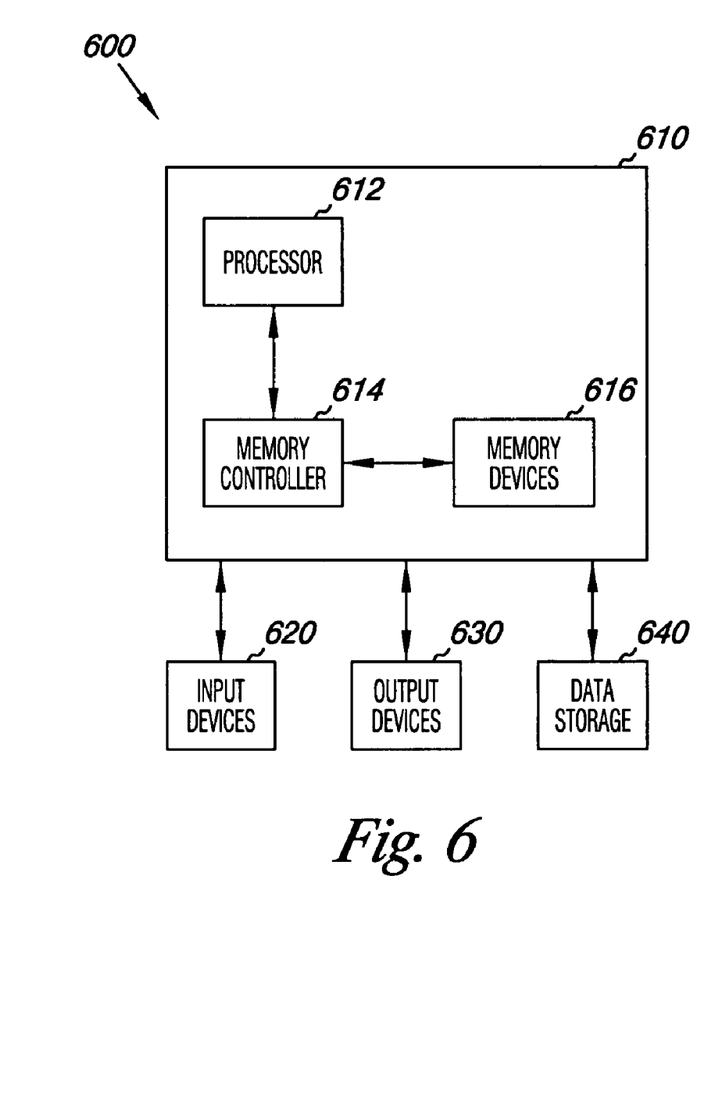
FIG. 6 illustrates a system including memory devices according to embodiments of the present disclosure.

FIG. 6 illustrates a system 600 including memory devices 616 according to embodiments of the present disclosure. That is, at least one of the memory devices 616 can include a DLL/PLL circuit with loop filtering for fast PLL locking, as described according to embodiments of the present disclosure. The system 600 includes a computing unit 610 with a processor 612, a memory controller 614, and the memory devices 616. The system 600 also includes input devices 620, output devices 630, and data storage 640.

Elements of the system 600 can perform various functions. The processor 612 can perform various computing functions, such as executing instructions to perform calculations or process data. The memory controller 614 can control communications to and from the memory devices 616, in response to control signals received from the processor 612. The memory devices 616 can transmit and receive data through the memory controller 614, and can also store such data.

The memory devices 616 can be various types of memory. For example, the memory devices 616 can be dynamic random access memory (DRAM), static random access memory (SRAM), flash memory, etc. DRAM embodiments can be synchronous DRAM, also referred to as synchronous graphics random access memory (SGRAM), SDRAM, SDRAM II, or double data rate SDRAM (DDR SDRAM), as well as Synchlink or Rambus DRAM. One or more of the memory devices 616 can incorporate embodiments of the present disclosure for PLL locking, as described above.

The input devices 620, output devices 630, and data storage 640, can include one or more of various devices. For example, input devices can include a keyboard, a transceiver, a mouse, etc. The input devices 620 can be used by an individual, a device, or another system, to communicate with the system 600. As an example, output devices can include printers, video terminals, monitors, display units, etc. The output devices can be used by the system 600 to communicate with an individual, with a device, or with another system. Examples of data storage can include hard disks, floppy disks, CDs, DVDs, and other media. The data storage 640 can be used to store various data.

The processor 612, the memory controller 614, and the memory devices 616 can be connected by one or more circuits, such as a bus (not shown). The input devices 620 and the output devices 630 can be internal to or external from the computing unit 610, in various embodiments. The data storage 640 can be provided to the computing unit 610 in various devices, such as disk drives, for reading from and/or writing to such data storage. Such devices and storage can be connected to the computing unit 610 in various ways, such as wired or wireless connections, using one or more open and/or proprietary communication protocols.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method of locking a PLL comprising:
   locking a DLL path while applying a control voltage of the DLL path to a loop filter of the DLL path;
   locking a DLL voltage while applying the control voltage of the DLL path to the loop filter of the DLL path; and
   transferring the control voltage from the loop filter of the DLL path to a loop filter of the PLL path after the DLL voltage locks.

2. The method of claim 1, including transferring the control voltage in response to a detection of the DLL voltage lock in a loop filter circuit shared by the DLL path and the PLL path.

3. The method of claim 1, including applying the control voltage through a bias generator shared by the DLL path and the PLL path to a VCO of the PLL path after the DLL voltage locks.

4. The method of claim 3, including locking the PLL path by using a phase frequency detector circuit shared by the DLL path and the PLL path after the DLL voltage locks.

5. A method of locking a DLL voltage comprising:
   generating a control voltage from a charge pump of the DLL path, while the DLL voltage locks;
   applying the control voltage to a loop filter of the DLL path; and
   adjusting an internal voltage in a loop filter of a PLL path towards the control voltage while applying the control voltage to the loop filter of the DLL path.

6. The method of claim 5, including adjusting the internal voltage until the internal voltage is substantially equal to the control voltage.

7. The method of claim 5, including:
   determining a voltage difference between the internal voltage and the control voltage;
   generating a control signal by using the voltage difference; and
   adjusting the internal voltage by using the control signal to reduce the voltage difference.

8. The method of claim 7, including:
   generating an up control signal if the internal voltage is less than the control voltage and outside a particular range of the control voltage; and
   generating a down control signal if the internal voltage is greater than the control voltage and outside the particular range of the control voltage.

9. The method of claim 8, including adjusting the internal voltage to a voltage inside the particular range of the control voltage by using the up control signal and the down control signal.

10. A method of locking a PLL, comprising:
    applying a current mirror output to a PLL loop filter of a PLL path while a DLL path locks;
    transferring an output of a charge pump circuit of the DLL path from a DLL loop filter of the DLL path to the PLL loop filter of the PLL path, after the DLL path locks; and
    applying the output of the charge pump circuit of the DLL path to the PLL loop filter while the DLL path relocks.

11. The method of claim 10, including using an output from a phase frequency detector circuit to:
    lock the DLL path;
    relock the DLL path; and
    lock the PLL path.

12. The method of claim 10, including applying a control voltage filtered by the PLL loop filter through a bias generator to a VCDL of the DLL path while the DLL path is relocking.

13. The method of claim 12, including applying the control voltage filtered by the PLL loop filter through the bias generator to a VCO of the PLL path while the PLL is locking.

14. The method of claim 13, applying the control voltage filtered by the PLL loop filter through the bias generator to a VCO of the PLL path until the PLL locks.

15. A method of locking a PLL, comprising:
    transmitting a feedback signal of a DLL path and a reference signal for the DLL path to a phase frequency detector, through a multiplexer;
    locking the DLL path by using a phase difference between the feedback signal of the DLL path and the reference signal of the DLL path detected by the phase frequency detector;
    relocking the DLL path by using a filtered signal from a PLL loop filter of a PLL path;
    transmitting a feedback signal of the PLL path and a reference signal for the PLL path to the phase frequency detector, through the multiplexer; and
    locking the PLL path by using a phase difference between the feedback signal of the PLL path and the reference signal of the PLL path detected by the phase frequency detector.

16. The method of claim 15, including transmitting the feedback signal of the DLL path and the reference signal for the DLL path to the phase frequency detector, through the multiplexer, in response to a signal from the phase frequency detector indicating that the DLL path is locking.

17. The method of claim 16, including transmitting the feedback signal of the PLL path and the reference signal for the PLL path to the phase frequency detector, through the multiplexer, in response to a signal from the phase frequency detector indicating that the DLL path is relocked.

18. The method of claim 17, including relocking the DLL path by using a phase difference between the feedback signal of the DLL path and the reference signal of the DLL path detected by the phase frequency detector.

19. The method of claim 18, wherein:
    locking the DLL path includes using an output from a charge pump circuit; and
    locking the PLL path includes using an output from the charge pump circuit.

20. The method of claim 19, including:
    locking the DLL path by using an output combined from a plurality of charge pumps in parallel; and
    locking the PLL path by using an output combined from the plurality of charge pumps in parallel.

21. A circuit comprising:
    a DLL path including a phase frequency detector circuit, a charge pump circuit, a loop filter circuit, a bias generator, and a VCDL;
    a PLL path including the phase frequency detector circuit, the charge pump circuit, the loop filter circuit, the bias generator, and a VCO; and
    wherein the loop filter circuit includes:
      a DLL loop filter;
      a PLL loop filter; and
      a loop filter charge pump with a loop filter charge pump output connected to the PLL loop filter.

22. The circuit of claim 21, wherein:
    the DLL loop filter is switchably connected to an output from the charge pump circuit through a switch circuit; and
    the PLL loop filter is switchably connected to the output from the charge pump circuit through the switch circuit.

23. The circuit of claim 21, wherein the loop filter circuit includes a comparator including:
    a first comparator input connected to an output of the charge pump; and
    a second comparator input connected to the PLL loop filter.

24. The circuit of claim 23, wherein the loop filter circuit includes a controller including:
a controller input connected to an output of the comparator; and
a controller output connected to an input of the loop filter charge pump.

25. The circuit of claim 24, wherein the controller output includes:
an up controller output connected to an up input of the loop filter charge pump; and
a dawn controller output connected to a down input of the loop filter charge pump.

26. A loop filter circuit comprising:
a DLL loop filter configured to receive a control voltage from a DLL path through a first switch;
a PLL loop filter configured to receive the control voltage from a PLL path through a second switch; and
a comparator configured to transmit a comparator output signal by using a difference between the control voltage from the DLL path and an internal voltage from the PLL loop filter.

27. The loop filter circuit of claim 26, wherein the first switch is configured to transmit the control voltage to the DLL loop filter in response to a signal indicating that the DLL voltage is locking.

28. The loop filter circuit of claim 27, wherein the DLL loop filter is a first order loop filter.

29. The loop filter circuit of claim 26, wherein the second switch is configured to transmit the control voltage to the PLL loop filter in response to a signal indicating that the DLL voltage locked.

30. The loop filter circuit of claim 29, wherein the PLL loop filter is a second order loop filter.

31. The loop filter circuit of claim 29, including a controller configured to transmit a control output signal to a loop filter charge pump, by using the comparator output signal.

32. The loop filter circuit of claim 31, including the loop filter charge pump configured to transmit a charge pump output to the PLL loop filter, by using the control output signal.

33. A circuit comprising:
a DLL path including a phase frequency detector circuit, a charge pump circuit, a loop filter circuit, a bias generator, and a VCDL;
a PLL path including the phase frequency detector circuit, the charge pump circuit, the loop filter circuit, the bias generator, and a VCO;
wherein the phase frequency detector circuit includes:
a multiplexer;
a DLL lock detector; and
a DLL relock detector; and
wherein the loop filter circuit includes:
a DLL loop filter switchably connected to an output from the charge pump circuit; and
a PLL loop filter switchably connected to an output from the charge pump circuit.

34. The circuit of claim 33, wherein the VCDL is configured to discontinue operating in response to a signal from the DLL relock detector indicating that the DLL path is relocked.

35. The circuit of claim 33, wherein the VCO is configured to begin operating in response to a signal from the DLL relock detector indicating that the DLL path is relocked.

36. The circuit of claim 33, wherein the loop filter circuit is configured to filter an output from the charge pump circuit for the DLL path with the DLL loop filter in response to a signal from the DLL lock detector indicating that the DLL path is locking.

37. The circuit of claim 33, wherein the loop filter circuit is configured to filter an output from the charge pump circuit for the DLL path with the PLL loop filter in response to a signal from the DLL lock detector indicating that the DLL path locked.

38. A phase frequency detector circuit, comprising
a multiplexer configured to receive a feedback signal from a VCDL of a DLL path, a reference signal for the DLL path, a feedback signal from a VCO of a PLL path, and a reference signal for the PLL path;
a phase frequency detector;
a DLL lock detector configured to transmit a DLL lock signal to the multiplexer and a loop filter circuit shared by the DLL path and the PLL path; and
a DLL relock detector configured to transmit a DLL relock signal to the multiplexer, the VCDL of the DLL path, and the VCO of the PLL path.

39. The circuit of claim 38, wherein the multiplexer is configured to transmit the feedback signal from the VCDL and the reference signal for the DLL path to the phase frequency detector, in response to a signal from the DLL lock detector indicating that the DLL path is locking.

40. The circuit of claim 39, wherein the phase frequency detector circuit is configured to detect a phase difference between the feedback signal from the VCDL and the reference signal for the DLL path, while the DLL path is locking.

41. The circuit of claim 40, wherein the multiplexer is configured to transmit the feedback signal from the VCO and the reference signal for the PLL path to the phase frequency detector, in response to a signal from the DLL relock detector indicating that the DLL path is relocked.

42. The circuit of claim 41, wherein the phase frequency detector circuit is configured to detect a phase difference between the feedback signal from the VCO and the reference signal for the PLL path, after the DLL path is relocked.

43. A loop filter circuit, comprising:
a DLL loop filter configured to receive a control voltage from a DLL path though a first switch;
a PLL loop filter configured to receive the control voltage from the DLL path through a second switch; and
a current mirror configured to charge the PLL loop filter.

44. The loop filter circuit of claim 43, wherein the second switch is configured to connect the control voltage to the PLL loop filter in response to a signal indicating that the DLL path is relocking.

45. The loop filter circuit of claim 44, wherein the current mirror is configured to charge the PLL loop filter in response to a signal indicating that the DLL path is relocking.

46. The loop filter circuit of claim 45, wherein the PLL loop filter is a higher order than the DLL loop filter.

47. The loop filter circuit of claim 46, wherein:
the DLL loop filter is a first order loop filter; and
the PLL loop filter is a second order loop filter.

48. A memory device, comprising:
a memory array;
a row decoder coupled to the memory array;
a column decoder coupled to the memory array; and
an input/output (I/O) circuit coupled to the column decoder, wherein the I/O circuit includes a synchronization circuit, the synchronization circuit including:
a DLL path including a phase frequency detector circuit, a charge pump circuit, a loop filter circuit, a bias generator, and a VCDL;
a PLL path including the phase frequency detector circuit, the charge pump circuit, the loop filter circuit, the bias generator, and a VCO;
wherein the loop filter circuit includes a DLL loop filter, a PLL loop filter, a controller, and a loop filter charge pump, wherein the loop filter charge pump is configured to provide a loop filter charge pump output to the PLL loop filter; and wherein the controller is configured to transmit a DLL voltage lock signal to the phase frequency detector circuit when an internal voltage of the PLL loop filter is substantially equal a control voltage output of the charge pump circuit.

49. The memory device of claim 48, wherein the loop filter circuit is configured to adjust the internal voltage of the PLL loop filter to substantially equal the control voltage output of the charge pump circuit by using the loop filter charge pump output.

50. The memory device of claim 48, wherein the loop filter circuit includes a switch circuit configured to transfer the control voltage output of the charge pump circuit from the DLL loop filter to the PLL loop filter, in response to a signal from the controller indicating DLL voltage lock.

51. A memory device, comprising:
a memory array;
a row decoder coupled to the memory array;
a column decoder coupled to the memory array; and
an input/output (I/O) circuit coupled to the column decoder, wherein the I/O circuit includes a synchronization circuit, the synchronization circuit including:
   a DLL path including a phase frequency detector circuit, a charge pump circuit, a loop filter circuit, a bias generator, and a VCDL;
   a PLL path including the phase frequency detector circuit, the charge pump circuit, the loop filter circuit, the bias generator, and a VCO; and
   wherein the phase frequency detector circuit includes a DLL lock detector, a DLL relock detector, a multiplexer configured to transmit signals to a phase frequency detector, and the phase frequency detector configured to transmit a signal to the charge pump circuit.

52. The memory device of claim 51, wherein:
the loop filter circuit is configured to filter an output from the charge pump circuit with a DLL loop filter, in response to a signal from the DLL lock detector indicating that the DLL path is locking; and
the multiplexer is configured to transmit a feedback signal from the VCDL and a reference signal for the DLL to the phase frequency detector, in response to a signal from the DLL lock detector indicating that the DLL path is locking.

53. The memory device of claim 52, wherein:
the loop filter circuit is configured to filter an output from the charge pump circuit with a loop filter of the PLL path, in response to a signal from the DLL lock detector indicating that the DLL path locked; and
the multiplexer is configured to transmit a feedback signal from the VCDL and a reference signal for the DLL to the phase frequency detector, in response to a signal from the DLL lock detector indicating that the DLL path locked.

54. A processor based system, comprising:
a data input device;
a data output device;
a processor coupled to the data input and data output devices; and
a memory device coupled to the processor, wherein the memory device includes:
   a memory array;
   a row decoder coupled to the memory array,
   a column decoder coupled to the memory array; and
   an input/output (I/O) circuit coupled to the column decoder, wherein the I/O circuit includes a synchronization circuit, the synchronization circuit including:
      a DLL path, including a VCDL;
      a PLL path, including a VCO; and
      a loop filter circuit, shared by the DLL path and the PLL path, and configured to transfer a control voltage from a loop filter of the DLL path to a loop filter of the PLL path, after DLL voltage lock.

55. The system of claim 54, wherein the loop filter circuit is configured to lock the DLL voltage by adjusting an internal voltage of the loop filter of the PLL path to substantially equal a control voltage of the DLL path.

56. The system of claim 55, wherein the synchronization circuit is configured to:
filter a control voltage of the PLL path with the loop filter of the PLL path; and
apply the filtered control voltage of the PLL path through a bias generator and to the VCO, after the DLL voltage lock.

57. A processor based system, comprising:
a data input device;
a data output device;
a processor coupled to the data input and data output devices; and
a memory device coupled to the processor, wherein the memory device includes:
   a memory array;
   a row decoder coupled to the memory array;
   a column decoder coupled to to-the memory array; and
   an input/output (I/O) circuit coupled to the column decoder, wherein the I/O circuit includes a synchronization circuit, the synchronization circuit including:
      a DLL path configured to filter a charge pump circuit output with a DLL loop filter while locking and configured to filter the charge pump output circuit with a loop filter of a PLL path while relocking;
      the PLL path; and
      a phase frequency detector circuit:
         shared by the DLL path and the PLL path;
         configured to detect a phase difference for the DLL path while the DLL path is locking and to detect a phase difference for the DLL path while the DLL path is relocking; and
         configured to detect a phase difference for the PLL path after the DLL path is relocked.

58. The system of claim 57, wherein:
the phase frequency detector circuit includes a DLL lock detector, configured to transmit a DLL lock signal; and
the DLL path is configured to filter a charge pump circuit output with the DLL loop filter, in response to the DLL lock signal indicating the DLL path is locking.

59. The system of claim 58, wherein the DLL path is configured to filter the charge pump circuit output with the loop filter of the PLL path, in response to the DLL lock signal indicating the DLL path locked.

* * * * *

UNITED STATES PATENT AND TRADEMARK OFFICE
CERTIFICATE OF CORRECTION

PATENT NO. : 7,443,761 B2  
APPLICATION NO. : 11/358266  
DATED : October 28, 2008  
INVENTOR(S) : Lin Page 1 of 1

It is certified that error appears in the above-identified patent and that said Letters Patent is hereby corrected as shown below:

In column 15, line 11, in Claim 25, delete "dawn" and insert -- down --, therefor.

In column 16, line 34, in Claim 43, delete "though" and insert -- through --, therefor.

In column 18, line 2, in Claim 54, delete "array," and insert -- array; --, therefor.

In column 18, line 32, in Claim 57, delete "to-the" and insert -- to the --, therefor.

Signed and Sealed this

Tenth Day of March, 2009

JOHN DOLL  
*Acting Director of the United States Patent and Trademark Office*